United States Patent
Iwaya et al.

(10) Patent No.: US 8,921,784 B2
(45) Date of Patent: Dec. 30, 2014

(54) SCANNING ELECTRON MICROSCOPE

(75) Inventors: Toru Iwaya, Hitchinaka (JP); Sakae Kobori, Shirosato (JP); Tomohisa Ohtaki, Hitachinaka (JP); Haruhiko Hatano, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 131 days.

(21) Appl. No.: 13/505,517

(22) PCT Filed: Nov. 12, 2010

(86) PCT No.: PCT/JP2010/070188
§ 371 (c)(1),
(2), (4) Date: May 2, 2012

(87) PCT Pub. No.: WO2011/065240
PCT Pub. Date: Jun. 3, 2011

(65) Prior Publication Data
US 2012/0211654 A1    Aug. 23, 2012

(30) Foreign Application Priority Data

Nov. 26, 2009   (JP) .................. 2009-268670

(51) Int. Cl.
| H01J 37/143 | (2006.01) |
| H01J 37/141 | (2006.01) |
| H01J 37/28  | (2006.01) |
| H01J 37/26  | (2006.01) |

(52) U.S. Cl.
CPC ............ *H01J 37/143* (2013.01); *H01J 37/141* (2013.01); *H01J 37/28* (2013.01); *H01J 37/26* (2013.01)
USPC ............................ 250/311; 250/310; 250/306

(58) Field of Classification Search
CPC .............................. H01J 37/141; H01J 37/143
USPC ............................................................. 250/310
See application file for complete search history.

(56) References Cited

U.S. PATENT DOCUMENTS 2,718,606 A * 9/1955 Zuerker ....................... 335/211
2,901,627 A * 8/1959 Wiskott et al. ............... 250/310
(Continued)

FOREIGN PATENT DOCUMENTS

| JP | 51 105764 | * | 9/1976 |
| JP | 52099765 |   | 8/1977 |

(Continued)

OTHER PUBLICATIONS

International Search Report from International Application No. PCT/JP2010/070188 mailed Dec. 7, 2010.

(Continued)

*Primary Examiner* — Robert Kim
*Assistant Examiner* — James Choi
(74) *Attorney, Agent, or Firm* — Brundidge & Stanger, P.C.

(57) ABSTRACT

There is provided a scanning electron microscope capable of achieving a size reduction of the device while at the same time suppressing the increase in column temperature as well as maintaining performance, e.g., resolution, etc. With respect to a scanning electron microscope for observing a sample by irradiating the sample with an electron beam emitted from an electron source and focused by condenser lenses, and detecting secondary electrons from the sample, the condenser lenses comprise both an electromagnetic coil-type condenser lens and a permanent magnet-type condenser lens.

6 Claims, 6 Drawing Sheets

(56) References Cited

U.S. PATENT DOCUMENTS

| | | | | |
|---|---|---|---|---|
| 4,508,967 | A * | 4/1985 | Boissel et al. | 250/396 R |
| 4,755,685 | A * | 7/1988 | Kawanami et al. | 250/492.2 |
| 4,806,766 | A * | 2/1989 | Chisholm | 250/396 ML |
| 5,371,371 | A * | 12/1994 | Yamazaki et al. | 250/396 R |
| 7,067,820 | B2 * | 6/2006 | Buijsse | 250/396 ML |
| 7,755,045 | B2 * | 7/2010 | Hatano et al. | 250/310 |
| 2006/0011836 | A1 * | 1/2006 | Kaji et al. | 250/310 |
| 2007/0284542 | A1 | 12/2007 | Ogashiwa et al. | |
| 2008/0067396 | A1 | 3/2008 | Ohshima et al. | |
| 2012/0001070 | A1 * | 1/2012 | Takagi | 250/310 |
| 2013/0134322 | A1 * | 5/2013 | Yasuda | 250/396 ML |

FOREIGN PATENT DOCUMENTS

| | | | |
|---|---|---|---|
| JP | 63-198246 | | 8/1988 |
| JP | 3-138841 | | 6/1991 |
| JP | 03138841 A | * | 6/1991 |
| JP | 04112440 | | 4/1992 |
| JP | 5-128986 | | 5/1993 |
| JP | 2003-346697 | | 12/2003 |
| JP | 2003346697 A | * | 12/2003 |
| JP | 2007-311117 | | 11/2007 |
| JP | 2008084823 | | 4/2008 |
| JP | 2008-204749 | | 9/2008 |
| JP | 2008204749 A | * | 9/2008 |

OTHER PUBLICATIONS

Japanese Office Action issued Nov. 19, 2013 in corresponding Japanese Patent Application No. 2011-543209.

* cited by examiner

SCANNING ELECTRON MICROSCOPE

TECHNICAL FIELD

The present invention relates to a scanning electron microscope for observing a sample by irradiating the sample with an electron beam emitted from an electron source, and detecting secondary electrons, etc., from the sample.

BACKGROUND ART

Due to an emphasis on operability and from the perspective of environmental friendliness, scanning electron microscopes with a specific focus on size reduction have been under development in recent years. Accordingly, there is a need to reduce the sizes of the condenser lenses provided in the column. In general, in order to reduce the size of an electromagnetic coil-type condenser lens, either the number of turns of the coil wire or the coil wire diameter has to be reduced.

If the number of turns were to be reduced with the coil wire diameter left unchanged, although the electromagnetic coil would naturally become smaller, the magnetic field strength would decrease. On the other hand, if the coil wire diameter were to be reduced with the number of turns left unchanged, although it would be possible to achieve a size reduction while maintaining the magnetic field strength, the resistance of the coil wire would increase, causing an increase in the amount of heat generated. Unless the magnetic field strength is maintained, the spot size of the electron beam with which the sample is irradiated cannot be made small, and the resolution of the scanning electron microscope cannot be maintained. In addition, if the column surface temperature were to rise due to an increase in the amount of heat generated, it would no longer be possible to meet various standards, such as IEC, etc. In terms of performance, image shifts, and focus offsets would occur due to temperature drift. Therefore, in order to reduce the size of an electromagnetic coil-type condenser lens, it is necessary to solve such problems as the decrease in magnetic field strength, and the increase in the amount of heat generated.

In order to solve such problems, by way of example, Patent Document 1 discloses a structure where, instead of electromagnetic coil-type condenser lenses, permanent magnet coil-type condenser lenses that are smaller than those of an electromagnetic coil-type are adopted.

PRIOR ART DOCUMENTS

Patent Documents

Patent Document 1: JP Patent Application Publication (Kokai) No. 2008-204749 A

SUMMARY OF THE INVENTION

Problems to be Solved by the Invention

However, because Patent Document 1 mentioned above does not use electromagnetic coil-type condenser lenses, and only uses permanent magnet coil-type condenser lenses, it experiments with adding condenser lenses to alter excitation conditions. In other words, with Patent Document 1, condenser lenses have to be attached/detached in order to alter the probe current or the spot size, which makes for poor operability and causes optical axis offset.

The present invention is made in view of such circumstances, and provides a scanning electron microscope with which a size reduction of the device may be attained while suppressing the increase in column temperature as well as maintaining performance such as resolution, etc.

Means for Solving the Problems

In order to solve the problems above, the present invention changes a portion of a plurality of electromagnetic coil-type condenser lenses to a permanent magnet-type condenser lens(es).

Specifically, a scanning electron microscope according to the present invention is a scanning electron microscope for observing a sample by irradiating the sample with an electron beam emitted from an electron source and focused by condenser lenses, and by detecting secondary electrons, backscattered electrons, and other signals from the sample, wherein the condenser lenses comprise both an electromagnetic coil-type condenser lens and a permanent magnet-type condenser lens.

In this case, the topmost condenser lens may be of a permanent magnet-type. In addition, there may also be provided a deflector that corrects the optical axis of the electron beam, the deflector being provided in at least one of the following manners: below, coaxially with, and above the permanent magnet-type condenser lens.

Effects of the Invention

With a scanning electron microscope of the present invention, it is possible to attain a size reduction for the device while suppressing the increase in column temperature as well as maintaining its performance, such as resolution, etc. Thus, in addition to improving the operability of the device, its handling may be simplified. In addition, since it is possible to reduce the device's power consumption, an environmentally friendly scanning electron microscope may be realized.

MODES FOR CARRYING OUT THE INVENTION

Figure 1:
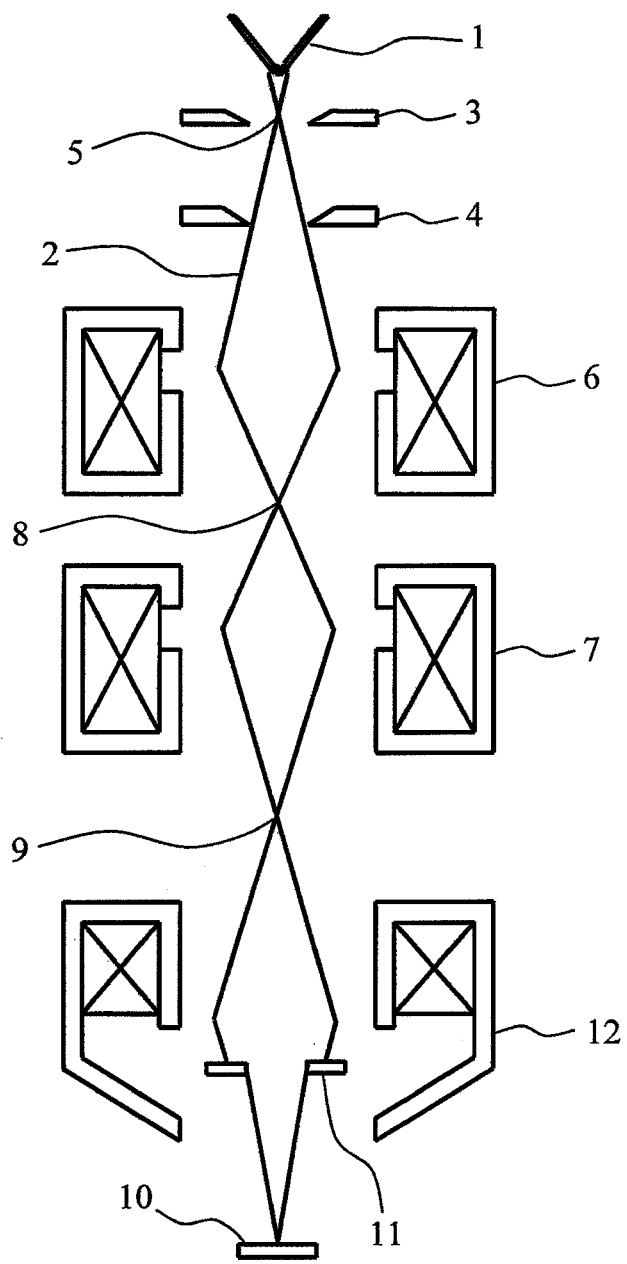
FIG. 1 is a schematic configuration diagram of an ordinary scanning electron microscope.

The present invention relates to a scanning electron microscope that obtains an image of a sample surface by irradiating a sample with an electron beam and detecting secondary electrons, etc., from the sample surface. Embodiments of the present invention are described below with reference to the accompanying drawings. However, it is to be noted that the embodiments herein are merely examples for realizing the present invention, and that they do not by any means limit the technical scope of the present invention. In addition, like elements are designated with like reference numerals across the various drawings.

<Ordinary Scanning Electron Microscope>

FIG. 1 is a schematic configuration diagram of an ordinary scanning electron microscope. An ordinary scanning electron microscope comprises: an electron source 1 that emits an electron beam 2; a Wehnelt electrode 3 that generates a negative voltage; an anode electrode 4 that generates a positive voltage; a first condenser lens 6 and a second condenser lens 7 that focus the accelerated electron beam 2; an objective lens 12 that adjusts the spot size on the sample; an objective aperture 11 that regulates the electron beam 2 that travels through the objective lens 12; and a sample stage 10 on which the sample is placed.

Next, the principles of an ordinary scanning electron microscope are described with reference to FIG. 1. Once the interior of the device has been evacuated to reach a target vacuum pressure, a high voltage is applied to the electron source 1. The electron beam 2 is emitted from the electron source 1 to which a high voltage has been applied. Due to the potential of the Wehnelt electrode 3, the emitted electron beam 2 is subjected to a focusing action, its trajectory is bent, and a first cross-over 5 is created between the Wehnelt electrode 3 and the anode electrode 4. Then, the electron beam 2 accelerated by the Wehnelt electrode 3 travels through the anode electrode 4, is subjected to a focusing action by the first condenser lens (electromagnetic coil-type) 6, and creates a second cross-over 8 between the first condenser lens 6 and the second condenser lens (electromagnetic coil-type) 7. Further, it creates a third cross-over 9 between the second condenser lens (electromagnetic coil-type) 7 and the objective lens 12. The electron beam 2 is focused by the objective lens 12 and regulated by the objective aperture 11, and irradiates the surface of the sample placed on the sample stage 10. The electron beam 2 irradiating the sample surface generates backscattered electrons that are reflected at the sample surface, secondary electrons that are emitted from the sample surface, and so forth. These backscattered electrons and secondary electrons are taken in by a detector installed with the sample chamber, fed to a display via an amplifier circuit and after being digitally converted, and may be viewed as a sample surface image on an operation screen. It is noted that the objective aperture 11 may be placed at some position other than that shown in FIG. 1.

<Scanning Electron Microscope of the Present Embodiments>

Figure 2:
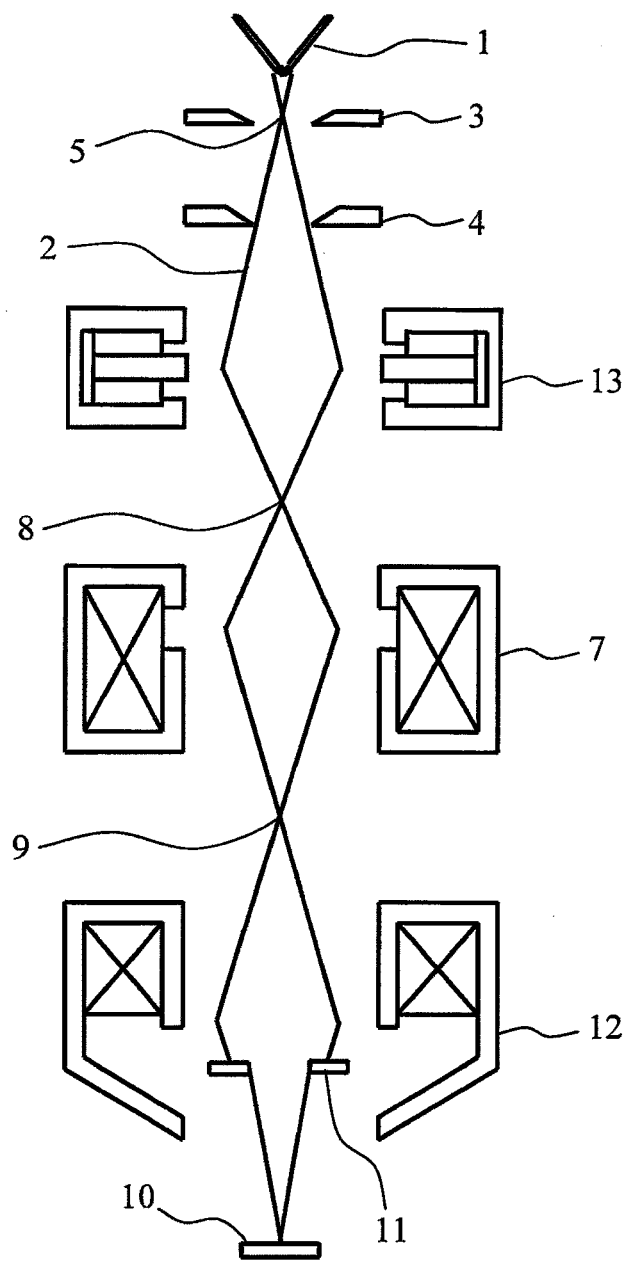
FIG. 2 is a schematic configuration diagram of a scanning electron microscope of the present invention.
Figure 3:
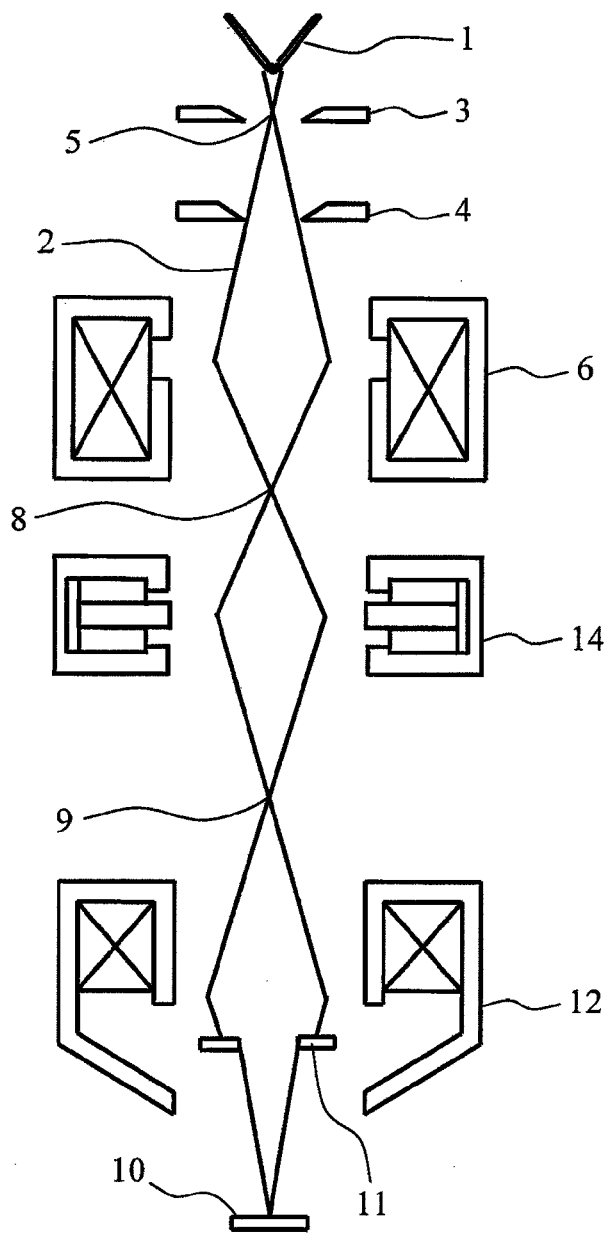
FIG. 3 is a schematic configuration diagram of a scanning electron microscope of the present invention.

FIG. 2 and FIG. 3 are schematic configuration diagrams of scanning electron microscopes of the present embodiments. As compared to the ordinary scanning electron microscope discussed above, scanning electron microscopes of the present embodiments differ in that the first condenser lens 6 or the second condenser lens 7 is replaced with a permanent magnet-type condenser lens 13 or 14. Since permanent magnet-type condenser lenses are small and light, it is more preferable to deploy a permanent magnet-type condenser lens for the first condenser lens as in FIG. 2, as it lowers the center of gravity, than it is to deploy a permanent magnet-type condenser lens for the second condenser lens as in FIG. 3. This is because a lower center of gravity results in better stability for the device, making it less susceptible to disturbance (vibration).

First, a description is provided with respect to a case where a permanent magnet-type condenser lens is employed for the first condenser lens 13 (FIG. 2). In this case, as with the ordinary scanning electron microscope discussed above, the electron beam 2 accelerated by the Wehnelt electrode 3 travels through the anode electrode 4, is subjected to a focusing action by the first condenser lens (permanent magnet-type) 13, and creates the second cross-over 8 between the first condenser lens (permanent magnet-type) 13 and the second condenser lens (electromagnetic coil-type) 7.

However, unlike an electromagnetic coil-type condenser lens, since the permanent magnet-type first condenser lens 13 is incapable of current control, the position of the second cross-over 8 in the up/down direction cannot be varied as desired. However, as for the third cross-over 9 created between the second condenser lens (electromagnetic coil-type) 7 and the objective lens 12, its position in the up/down direction may be varied by controlling the current of the second condenser lens (electromagnetic coil-type) 7.

Next, a description is provided with respect to a case where a permanent magnet-type condenser lens is employed for the second condenser lens 14 (FIG. 3). In this case, too, the electron beam 2 accelerated by the Wehnelt electrode 3 travels through the anode electrode 4, is subjected to a focusing action by the first condenser lens (electromagnetic coil-type) 6, and creates the second cross-over 8 between the first condenser lens 6 and the second condenser lens (permanent magnet-type) 14. The position of this second cross-over 8 in the up/down direction may be varied by controlling the current of the first condenser lens (electromagnetic coil-type) 6. However, as for the third cross-over 9 obtained between the second condenser lens 14 and the objective lens 12, its position in the up/down direction cannot be varied as desired since the permanent magnet-type second condenser lens 14 is incapable of current control. Accordingly, the spot size of the probe current on the sample is adjusted by controlling the current of the first condenser lens (electromagnetic coil-type) 6.

As described above, in the present embodiments, a portion of the plurality of electromagnetic coil-type condenser lenses disposed along the trajectory of the electron beam 2 is/are changed to a permanent magnet-type condenser lens(es).

By virtue of such a structure, it is possible to realize a reduction in the size of the scanning electron microscope and to simplify its handling, while at the same time maintaining a function of adjusting the spot size on the sample and the probe current. Furthermore, at least one electromagnetic coil-type condenser lens'-worth of heat may be reduced, thereby realizing an environmentally friendly scanning electron microscope.

<Alignment of Scanning Electron Microscopes of the Present Embodiments>

Figure 4:
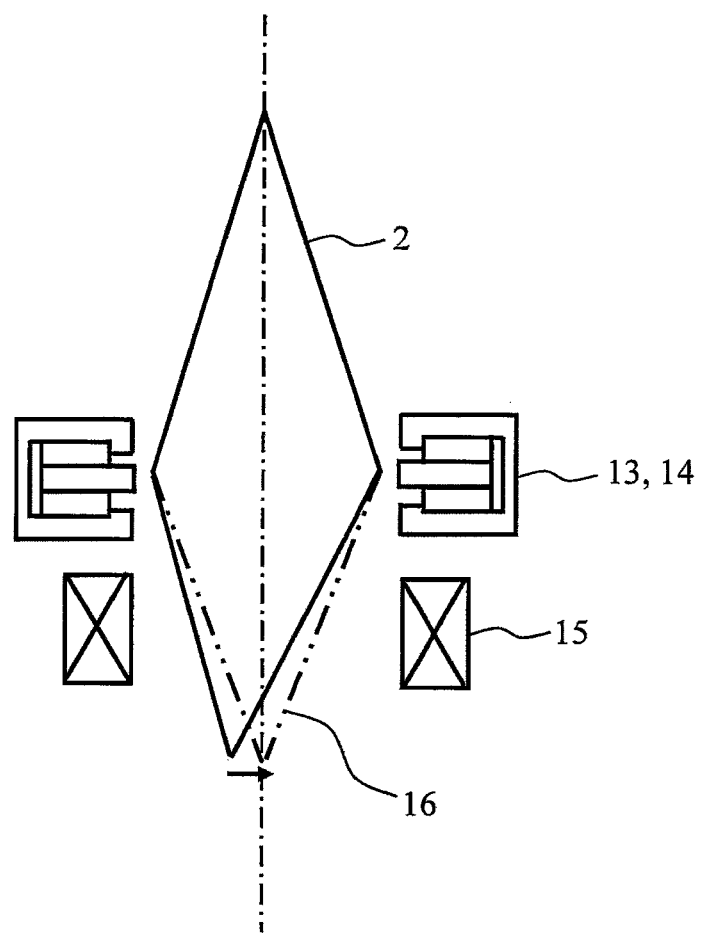
FIG. 4 is a diagram illustrating alignment by a deflector (lower) according to a scanning electron microscope of the present invention.
Figure 5:
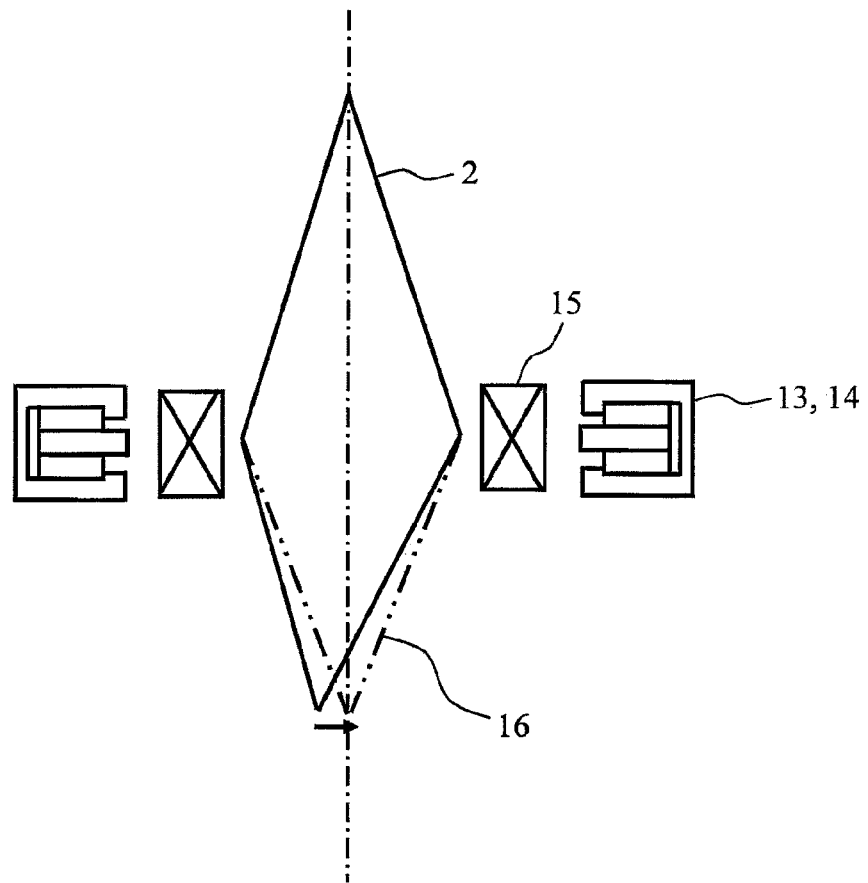
FIG. 5 is a diagram illustrating alignment by a deflector (middle) according to a scanning electron microscope of the present invention.
Figure 6:
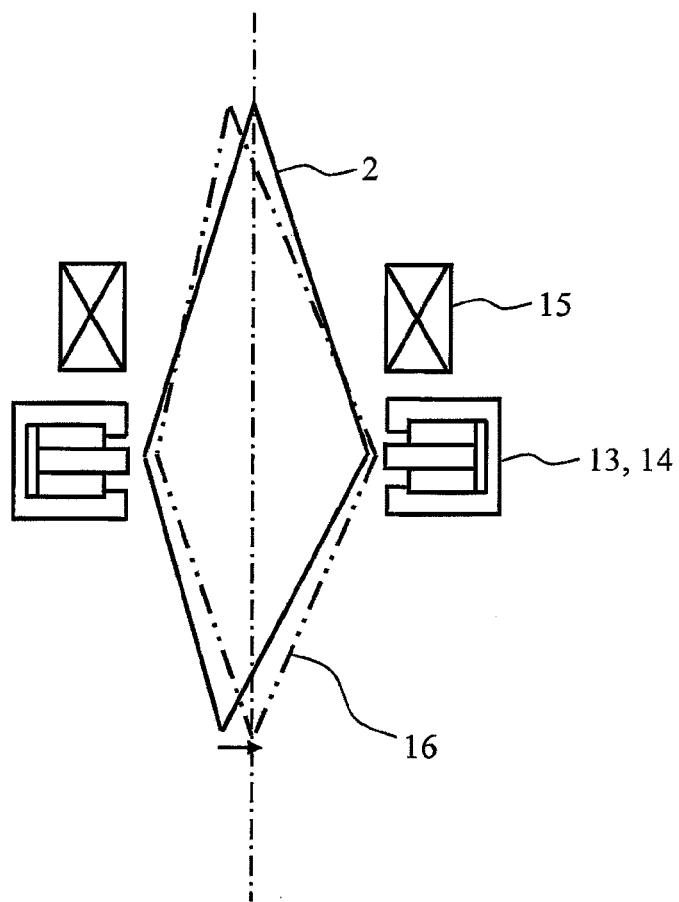
FIG. 6 is a diagram illustrating alignment by a deflector (upper) according to a scanning electron microscope of the present invention.

FIGS. 4 to 6 are diagrams illustrating alignment by deflectors according to scanning electron microscopes of the present embodiments. As the accelerating voltage of the Wehnelt electrode 3 or the anode electrode 4 varies, the electron beam 2 that has traveled through the permanent magnet-type condenser lens 13 or 14 changes with regard to the position of the cross-over in the up/down direction.

In the case of a high accelerating voltage, the electron beam 2 undergoes strong acceleration and is likely to travel straight, as a result of which it becomes long-focus, and less prone to optical axis offset. However, in the case of a low accelerating voltage, the electron beam 2 becomes short-focus and prone to optical axis offset. In order to correct this optical axis offset, in the present embodiments, a deflector 15 is disposed below (on the lower side of) (FIG. 4) the permanent magnet-type condenser lens, coaxially therewith (sharing the same center axis as the condenser lens) (FIG. 5), or thereabove (on the upper side thereof) (FIG. 6).

In FIGS. 4 and 5, a corrective magnetic field is applied to the electron beam 2 after an optical axis offset has already occurred to correct the optical axis offset, whereas in FIG. 6, a corrective magnetic field in the opposite direction to the direction of the optical axis offset is pre-applied to the electron beam to correct the optical axis offset. In addition, in FIG. 5, due to its structure, where the deflector 15 is disposed coaxially with the permanent magnet-type condenser lens 13 or 14, the hole diameter of the permanent magnet-type condenser lens inevitably becomes larger at the risk of potentially decreasing the magnetic field strength. Accordingly, for control and structural purposes with respect to the deflector, FIG. 4 is the most preferable embodiment. It is noted that while the deflectors in FIGS. 4 to 6 are of a magnetic field-type, they may also be of an electric field-type. Further, a plurality of the deflectors in FIGS. 4 to 6 may be combined as well.

In general, permanent magnet-type condenser lenses involve numerous components in their manufacturing process, and it is difficult to control individual variations. Accordingly, scanning electron microscopes using permanent magnet-type condenser lenses were prone to optical axis offset, and had device performance issues. As such, in the present embodiments, the deflector 15 that corrects optical axis offset is provided in order to solve this problem.

Thus, by applying to the deflector 15 an electric field or magnetic field that would cancel the optical axis offset, the electron beam 2 is corrected, thereby producing an electron beam 16 of a normal trajectory. Thus, it becomes possible to obtain a good-quality image regardless of the accelerating voltage.

SUMMARY

According to scanning electron microscopes of the present embodiments, a portion of the electromagnetic coil-type condenser lenses is/are changed to a permanent magnet-type condenser lens(es).

Thus, by virtue of the permanent magnet-type condenser lens(es), it is possible to realize a reduction in the size of the scanning electron microscope and to simplify its handling, while at the same time maintaining, by virtue of the electromagnetic coil-type condenser lens(es), a function of adjusting the spot size on the sample and the probe current. Furthermore, at least one electromagnetic coil-type condenser lens'-worth of heat may be reduced, thereby realizing an environmentally friendly scanning electron microscope.

Further, according to scanning electron microscopes of the present embodiments, a deflector is disposed below, coaxially with, or above a permanent magnet-type condenser lens.

Thus, the optical axis offset of the electron beam is corrected, and it becomes possible to obtain a good-quality image regardless of the accelerating voltage.

As described above, as compared to conventional scanning electron microscopes, since scanning electron microscopes of the present embodiments have a specific focus on size reduction, they are capable of serving diverse purposes ranging from not only specialized research and testing, as in conventional scanning electron microscopes, but also to education and personal hobby-use. noted that although in the present embodiments, descriptions have been provided with respect to methods for reducing size while maintaining the performance of the scanning electron microscope, it goes without saying that by leaving the size of the device itself unchanged, the performance of the scanning electron microscope may be improved, e.g., improved magnetic field strength, improved resolution, reduced heat, etc.

LIST OF REFERENCE NUMERALS

1 Electron source
2 Electron beam
3 Wehnelt electrode
4 Anode electrode
5 First cross-over
6 First condenser lens (electromagnetic coil-type)
7 Second condenser lens (electromagnetic coil-type)
8 Second cross-over
9 Third cross-over
10 Sample stage
11 Objective aperture
12 Objective lens
13 First condenser lens (permanent magnet-type)
14 Second condenser lens (permanent magnet-type)
15 Deflector

The invention claimed is:

1. A scanning electron microscope for observing a sample by irradiating the sample with an electron beam emitted from an electron source and focused by condenser lenses, and detecting secondary electrons or backscattered electrons from the sample, comprising:
   a Wehnelt electrode or an anode electrode adapted to change an accelerating voltage; and
   an objective aperture adapted to regulate the electron beam, wherein
   the condenser lenses comprise both an electromagnetic coil-type condenser lens and a permanent magnet-type condenser lens,
   the permanent magnet-type condenser lens is arranged in the scanning electron microscope to focus the electron beam emitted from the electron source,
   the electromagnetic coil-type condenser lens is arranged in the scanning electron microscope after the permanent magnet-type condenser lens to focus the electron beam focused by the permanent magnet-type condenser lens, and
   the electromagnetic coil-type condenser lens is adapted to be controlled to change a position in an up/down direction of a cross-over created between the electromagnetic coil-type condenser lens and an objective lens, to adjust a spot size on the sample, and to adjust a probe current.

2. The scanning electron microscope according to claim 1, wherein the topmost condenser lens is of a permanent magnet-type.

3. The scanning electron microscope according to claim 1, further comprising a deflector that corrects the optical axis of the electron beam, the deflector being provided in at least one of the following manners: below, concentric with, and above the permanent magnet-type condenser lens.

4. The scanning electron microscope according to claim 2, further comprising a deflector that corrects the optical axis of the electron beam, the deflector being provided in at least one of the following manners: below, coaxially with, and above the permanent magnet-type condenser lens.

5. A scanning electron microscope for observing a sample by irradiating the sample with an electron beam emitted from an electron source and focused by condenser lenses, and detecting secondary electrons or backscattered electrons from the sample, comprising:
   a Wehnelt electrode or an anode electrode adapted to change an accelerating voltage; and
   an objective aperture adapted to regulate the electron beam, wherein
   the condenser lenses comprise both an electromagnetic coil-type condenser lens and a permanent magnet-type condenser lens,
   the electromagnetic coil-type condenser lens is arranged in the scanning electron microscope to focus the electron beam emitted from the electron source, the permanent magnet-type condenser lens is arranged in the scanning electron microscope after the electromagnetic coil-type condenser lens to focus the electron beam focused by the electromagnetic coil-type condenser lens, and the electromagnetic coil-type condenser lens is adapted to be controlled to change a position in an up/down direction of a cross-over created between the electromagnetic coil-type condenser lens and an objective lens, to adjust a spot size on the sample, and to adjust a probe current.

6. The scanning electron microscope according to claim 5, further comprising a deflector that corrects the optical axis of the electron beam, the deflector being provided in at least one of the following manners: below, concentric with, and above the permanent magnet-type condenser lens.

* * * * *